United States Patent
Durante et al.

(10) Patent No.: US 7,437,499 B2
(45) Date of Patent: Oct. 14, 2008

(54) DIVIDING A FLASH MEMORY OPERATION INTO PHASES

(75) Inventors: Richard J. Durante, El Dorado Hills, CA (US); Jerry A. Kreifels, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 315 days.

(21) Appl. No.: 11/322,918

(22) Filed: Dec. 30, 2005

(65) Prior Publication Data

US 2007/0156950 A1    Jul. 5, 2007

(51) Int. Cl.
G06F 12/00    (2006.01)

(52) U.S. Cl. .................................... 711/103

(58) Field of Classification Search .............. 711/103, 711/167, 169
See application file for complete search history.

(56) References Cited

U.S. PATENT DOCUMENTS

| | | | | |
|---|---|---|---|---|
| 5,572,478 A | * | 11/1996 | Sato et al. | 365/226 |
| 2005/0092846 A1 | * | 5/2005 | Lai et al. | 235/492 |

* cited by examiner

Primary Examiner—Hiep T Nguyen
(74) Attorney, Agent, or Firm—Trop, Pruner & Hu, P.C.

(57) ABSTRACT

A flash memory that could not have completed an operation within a time required by a host may be able to work with the host by dividing the operation into phases that may be completed within the allocated time. As a result, a type of memory that would otherwise be unable to be implemented in a format, such as a memory card, may be used effectively.

24 Claims, 4 Drawing Sheets

DIVIDING A FLASH MEMORY OPERATION INTO PHASES

BACKGROUND

This invention relates generally to memory cards.

A memory card includes a controller and a plurality of flash memory die on a board. The card works with a host such as a computer, a card interface, or a card reader or writer. A host can be any device that can read from or write to a memory card. The host may expect a response within a time specification for any command sent by the host to the card.

If the card is powered off by the host during an operation, such as erasing, that is incomplete, the card, and the data on the card, may sustain damage. Some operations require more time than a host may allow, causing a timeout and powering off of the memory card when a response from a memory card is not provided within the allowed time period.

DETAILED DESCRIPTION

A memory card can comprise different types of flash memory. An example of flash memory that can be used in a memory card, according to some embodiments, is NOR flash memory. NOR flash memory can comprise a plurality of flash memory cells that are erased through their sources.

In some embodiments, operations performed on NOR flash memory can take more time than a memory card host may allow. These operations may make certain types of flash memory, such as NOR flash, unsuitable for memory cards that require that a host receive a response from the memory card in a time period that is shorter than the time that the memory uses for some operations. For example, some embodiments of NOR type flash memory can take over 250 milliseconds to complete an erase operation and some memory cards require a response in less than 250 milliseconds.

In some embodiments, NOR flash memory is less expensive to manufacture than other types of flash memory such as NAND flash memory. A less expensive flash can be desirable for use in products such as secure digital memory cards.

To use NOR flash memory in products such as memory cards, an erase operation can be performed in phases. A phase can be one part of an operation that is performed in at least two parts. The phases of the erase operation can then be performed in less than a host specified time limit for receiving a response from the memory card. This can allow a host coupled to the memory card to receive a ready signal from the card within such time limit and can prevent the host from initiating a timeout and powering down the memory card before the operation has been completed.

If a host still powers down a memory card to save energy, the next phase of the erase operation can be performed when the host powers up the memory card, or if the memory card was not powered down after the previous phase, the next phase can proceed automatically.

Figure 1:
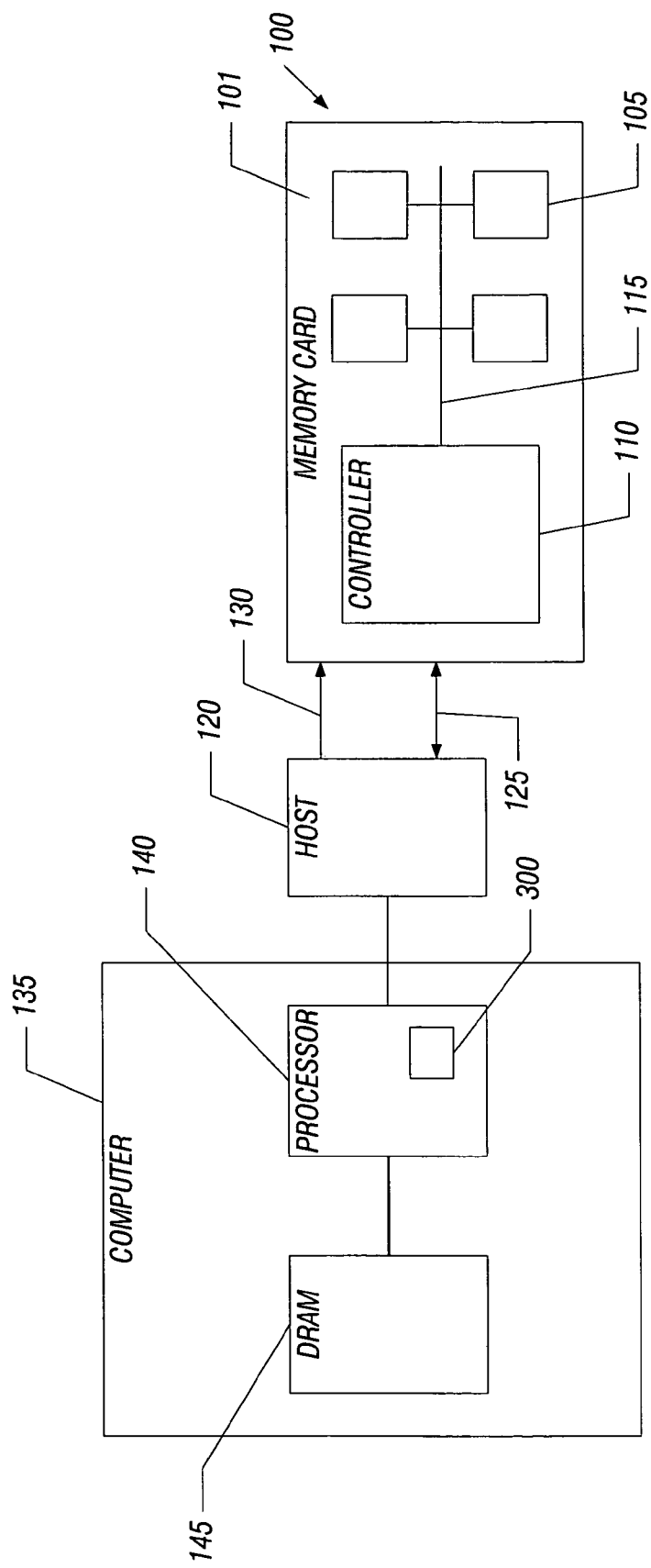
FIG. 1 is a schematic depiction of a system in accordance with one embodiment.

The memory card 100, shown in FIG. 1, can comprise a plurality of flash memory dice 105 coupled by a bus 115 to a controller 110, all mounted on a board 101 such as a printed circuit board. The memory dice 105 may be NOR flash memory dice in one embodiment. The controller 110 may be a microcontroller in one embodiment.

The memory card 100 can be coupled to a host 120 such as a personal computer, a card reader or a card writer or a card interface. The host 120 can power the memory card 100 through a connection 130 and send and receive data through bus 125.

The host 120 may issue commands, including erase commands, to the card 100 which, in turn, may respond with a ready signal. The host 120 can be coupled to a computer 135. The computer can comprise a processor 140 connected to a dynamic random access memory 145.

The host 120 can send an erase operation request to the memory card 100 to perform a memory erase operation on a block of cells in a flash memory die 105. The controller 110 can receive the erase operation request from the host 120. The controller can then determine if the erase operation can be performed within the time specified to return a ready signal to the host. If the controller determines that the erase operation cannot be performed within the time specified to return a ready signal to the host 120, the controller 110 can automatically divide the erase operation into phases.

The phases of an erase operation may include a preprogram phase, an erase operation phase, and a fine-tuning phase in one embodiment. The different phases may reduce the variance in threshold voltages between the plurality of memory cells in the memory die. Reducing the variance of threshold voltages can reduce the time that is taken to perform an erase operation because not all cells erase at the same speed or the same threshold voltage.

The necessary erase operation time may also depend on the size of a block that is being erased. A one megabyte block may take approximately 1.2 seconds to erase. A flash memory with an erase time longer than the host required response time can be used in a memory card by dividing the erase operation into phases. In one embodiment, with a 1.2 second erase time, six phases may be used with a 250 millisecond host required maximum response time, causing each phase to be less than 200 milliseconds. At the end of each 200-millisecond phase, a ready signal can be sent to the host so that the host does not timeout.

Figure 2:
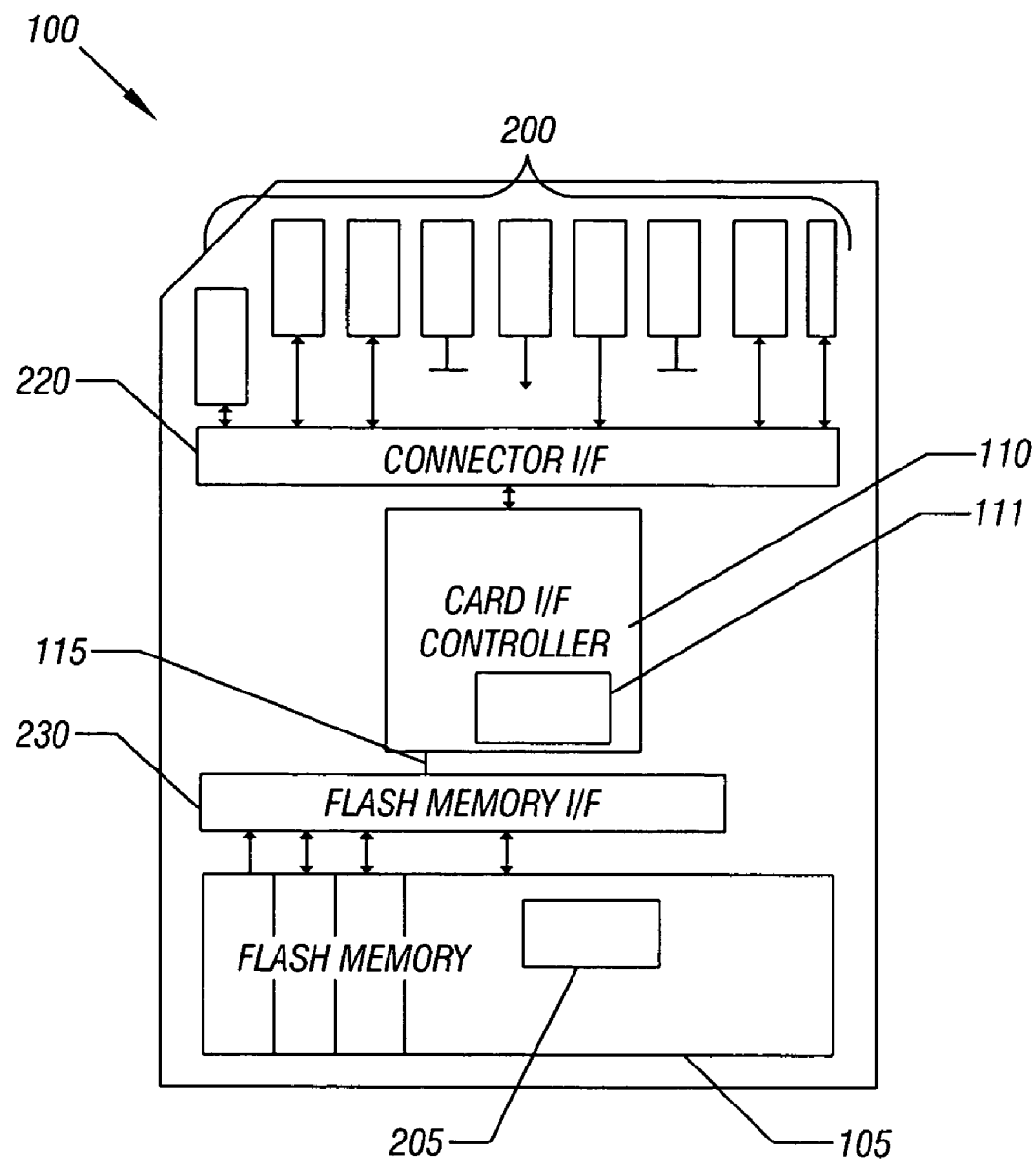
FIG. 2 is a schematic depiction of a memory card according to one embodiment.

The memory card 100, shown in FIG. 2, can comprise a connector 200 to connect to a host. The connector 200 can be coupled to a connector interface 220. The connector interface 220 can be coupled to an interface controller 110. The controller 110 can be coupled to a flash memory interface 230 via bus 115. The bus can carry different signals between the flash memory dice 105 and the controller 110. The signals carried on the bus 115 can be, for example, an address and phase information identifying a block of memory and a phase of an erase operation to be performed on that block of memory 205, in one embodiment. In another embodiment, the bus 115 can transmit data to be stored on a flash memory die 105.

In some embodiments, firmware stored in a storage 111 on the controller 110 is changed to allow an operation to be performed in phases while the hardware of the controller and the flash memory are not changed.

Flash memory is erased in blocks. A block of memory can comprise a plurality of memory cells. The number of memory cells in the block can include addresses with the same higher-order bits. The lower-order bits can identify an individual memory cell within the block. The lower-order bits can be discarded because the lower order bits identify memory cells within blocks and an erase operation is performed on a block of flash memory. The space used for the discarded bits within the address of the block to be erased can be used by the controller to provide phase information to a memory die.

If the block of memory to be erased is 1 megabyte, approximately 16 bits can be discarded from the address. With 16 available bits, phase information can be provided. The phase information may indicate a phase of the erase operation to perform on the addressed block of a flash memory die.

For ease of illustration an eight bit address is described in the following example. If an address of 00010010 indicates a particular block of memory to be erased in the flash memory die and the higher order four bits, 0001, indicate the selected block, while the lower-order bits, 0010, only indicate the locations of individual memory cells within the block, the lower order bits, 0010, can be discarded. The phase of the erase operation to be performed can be stored in place of these four bits. If the phase of the erase operation to be performed is the first phase of the erase operation, the lower-order bits of the address can be four consecutive zeroes or another sequence that is equal to or smaller than the number of bits that can be discarded in the address. For example, the address transmitted from the controller to the flash memory representing a first phase of an erase operation can be 0001 representing the block of memory to be erased and 0000 representing that the first phase of the operation can be performed, for an address of 00010000. The embodiments are not limited to a specific number of address bits. Although the embodiment described discards the lower-order bits of an address to a block of memory the embodiments are not limited to discarding lower-order bits if the block of memory can be identified by the remaining address bits.

When the flash memory die has completed a phase of the erase operation, a ready signal can be sent by the controller 110 through the connector interface 220 and the connector 200 to the host. The host may power down the memory card 100 including the controller 110 and the flash memory dice 105 in response to receipt of the ready signal. The controller 110 can temporarily save the phase information to a flash memory die 105 in a block other than the block that is being erased, before the memory card is powered down. At a future time, when the host powers up the memory card 100, the controller can retrieve the phase information stored in the flash memory and can send the address, including the phase information regarding the next phase of the erase operation to be completed, to the flash memory interface 230 for the addressed flash memory die 105.

In some embodiments, a host can request an erase suspend operation. An erase suspend can save the state information on an operation in progress on the memory card and allow a new operation to occur. The erase operation can continue once the new operation is complete and a ready signal sent to the host. If the ready signal is received by the host, the memory card can be powered down by the host. Performing the erase operation in phases and storing the phase information temporarily on a flash memory die 105 can prevent the loss of the erase suspend state information. The erase suspend state information can be retrieved when a memory card is powered up after the host has completely powered down the memory card.

Figure 3:
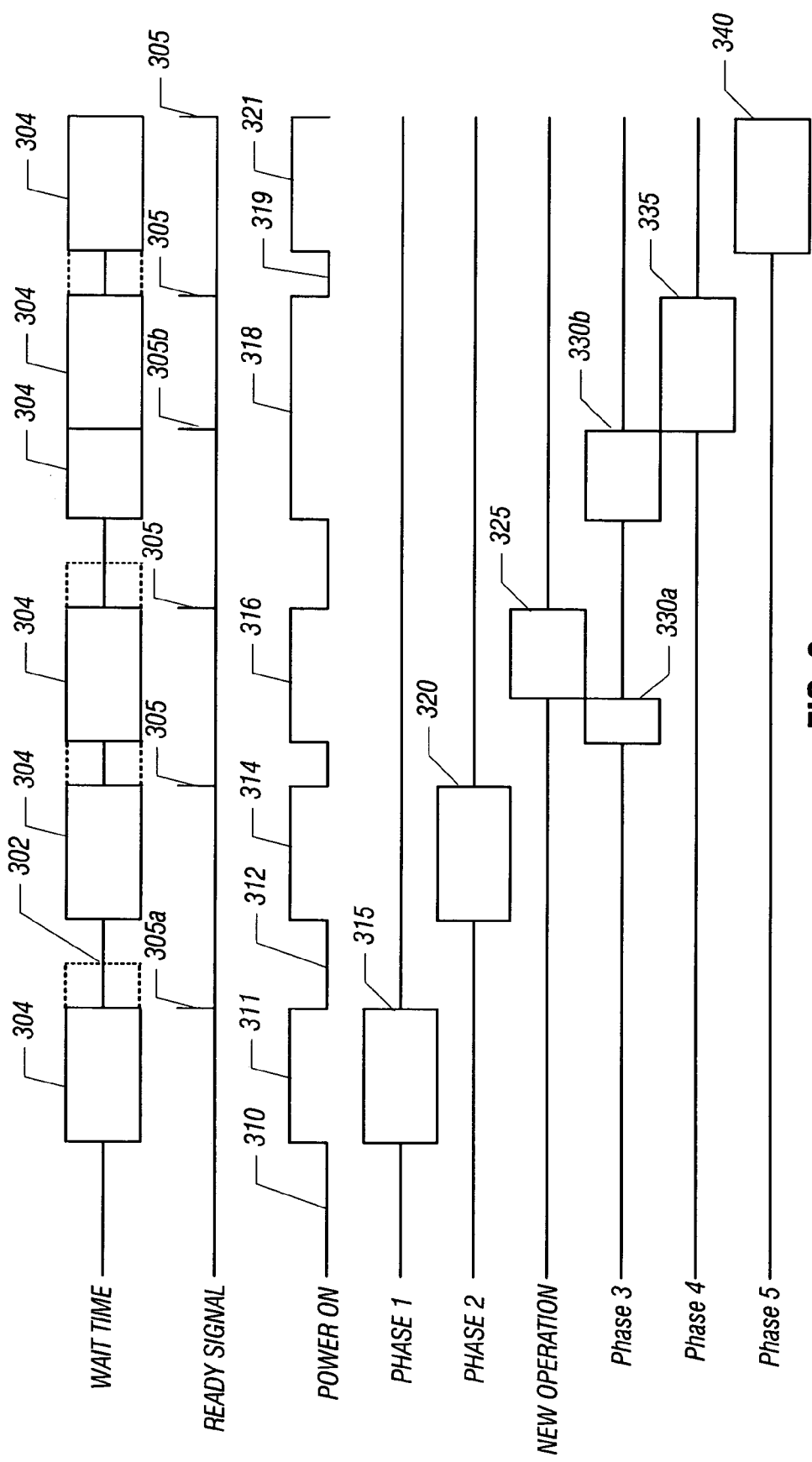
FIG. 3 is a timing chart showing the operation of an embodiment of a memory card.

A timer 300, in the processor 140, shown in FIG. 1, keeps track of the time that elapses after a request is issued. As shown in FIG. 3, the timer 300 may issue pulses 304 that correspond in length to the maximum required card response time. The timer 300 can be interrupted by a ready signal 305 from the card 100.

A request for an operation can cause the host to supply power to the memory card 100. The power on signal 310 can be influenced by the ready signal and the wait time after the memory card is powered down. Requests can be operations such an erase or write to the memory.

In one embodiment, an erase operation may be broken into five phases. When the request 315 to perform phase one is sent, the timer 300 begins and the power is turned on as indicated by pulse 311. A ready signal 305a is sent when the phase one is complete. The power to the memory card can be turned off (312) and the timer 300 reset (302).

Phase two 320 can begin when the power is restored (314) to the memory card. A new operation may cause an erase suspend operation to occur. The new operation 325 can cause the power to be restored (316). During the delay between when the new operation 325 is received and the powering on of the memory, a portion 330a of phase three can be completed. Once the new operation 325 is ready it can be completed. The remainder 330b of the phase three operation can be completed when the power is next restored (318) to the memory.

Sometimes the host does not power down the memory between operations. When phase three is complete a ready signal 305b can be sent to the host by the controller 110. The timer 300 is reset and the next operation can begin. Phase four begins (335) after the ready signal 305b is received for phase three 330. If the memory is powered down (319) after phase four, phase five 340 can begin when the memory is powered on (321).

Figure 4:
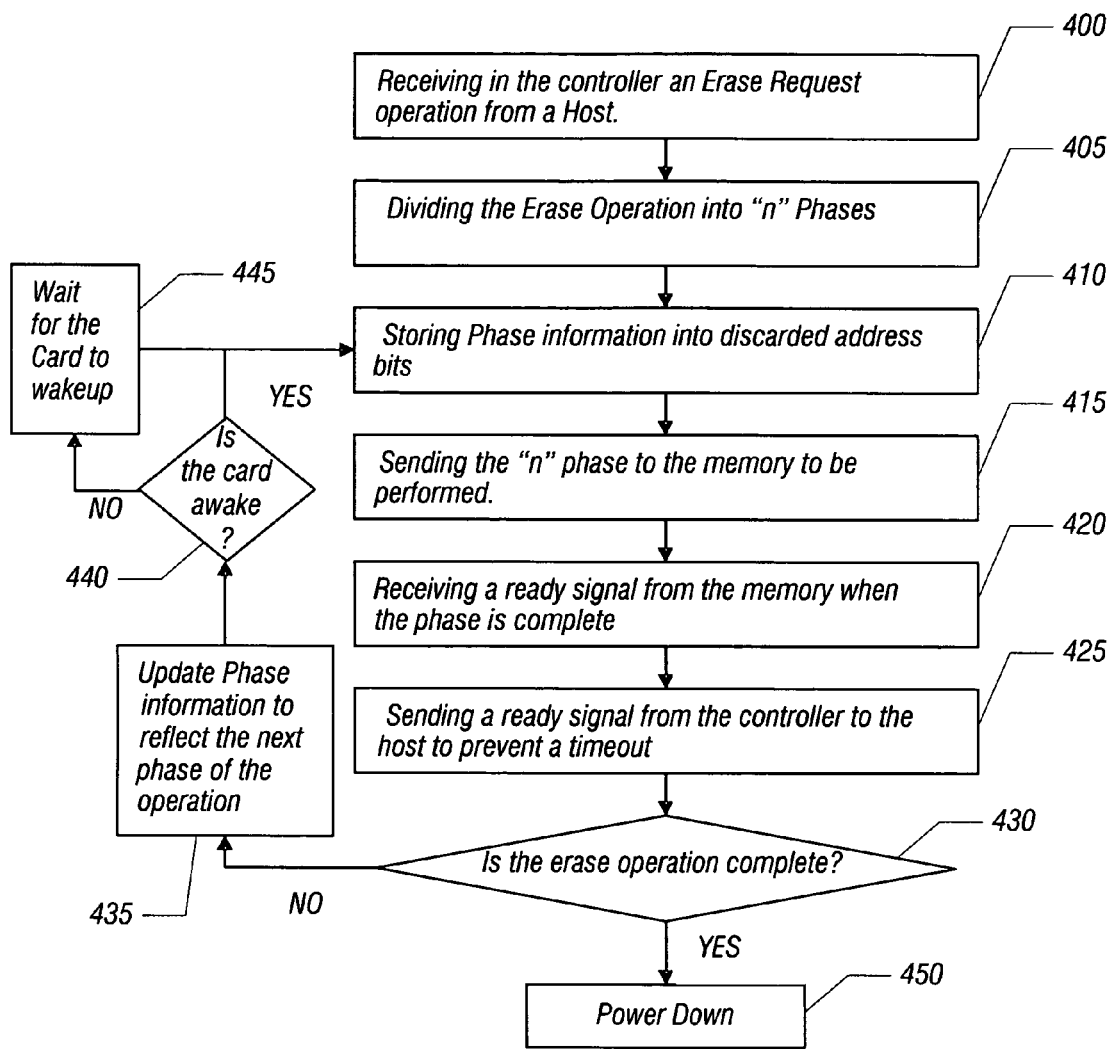
FIG. 4 is a flow chart for an embodiment of a memory card.

A process, shown in FIG. 4, may be implemented in hardware, software, or firmware. In one embodiment, it may be implemented by the controller 110 using firmware stored in the controller 110 storage 111 (FIG. 2).

The controller can receive a request for an erase operation from a host at block 400. The controller can divide the erase operation into separate phases at block 405. The number of phases can be represented by n. The number of phases, n, can be determined by the time required for the erase operation, the response time required by the host, the size of the block to be erased, and the divisibility of the erase operation.

The controller can write phase information into address bits that can be discarded at block 410, where the discarded address bits would have been unnecessarily directed to a specific cell in a block of memory to be erased as a whole. The controller can send the block address information to the addressed flash memory die at block 415, with an indication of the phase of the memory operation to be performed occupying the location that would have included the unnecessary address bits.

At block 420, the controller can receive a ready signal when the phase is complete. The controller can send a ready signal to the host to prevent a timeout and/or a power down at block 425. If the erase operation is complete, as determined at diamond 430, the memory card can be powered down by the host at block 450. If it is determined that the erase operation is not complete at diamond 430, then the phase information can be updated at block 435 to reflect the next phase of the erase operation. If the host has powered down the memory card at block 450 and the host does not power up the memory card, the decision is made at diamond 440 to wait at block 445 for the card to power up. If the card is powered up, the phase information of the next phase of the erase operation to be performed is stored in place of the discarded address bits at 410. This process can repeat until all the phases of the erase operation are performed.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   automatically separating a memory operation in a memory card into a first and second phase, so that the first phase is capable of being completed within a time allowed by a host.

2. The method of claim 1 including discarding address information and providing phase information in lieu of the discarded address information.

3. The method of claim 2 including identifying a block of memory from an address.

4. The method of claim 2 including identifying a phase from said phase information and performing only a portion of an erase operation.

5. The method of claim 1 including generating a ready signal to a host upon completion of a phase.

6. The method of claim 5 including preventing the memory from powering down when the ready signal is generated.

7. The method of claim 1 including enabling a NOR flash memory to operate with a host that requires completion of an erase operation by the memory within a time period shorter than the time required by the flash memory to complete the erase operation.

8. A computer readable medium storing instructions that, if executed, enable a device to:
   automatically separate a memory operation in a memory card into a first and second phase, so that each phase is capable of being completed within a time allowed by a host.

9. The medium of claim 8 further storing instructions that, if executed, enable the device to discard address information and provide phase information in lieu of the discarded address information.

10. The medium of claim 9 further storing instructions that, if executed, enable the device to identify a block of memory from an address.

11. The medium of claim 10 further storing instructions that, if executed, enable the device to identify a phase from said phase information and perform only a portion of an erase information.

12. The medium of claim 8 further storing instructions that, if executed, enable the device to generate a ready signal to a host upon completion of a phase.

13. The medium of claim 12 further storing instructions that, if executed, enable the device to prevent the memory from powering down when the ready signal is generated.

14. A memory card comprising:
   a support;
   a controller mounted on said support, said controller to automatically separate a memory operation requested by a host into a first and second phase so that the first phase is capable of being completed within a time allowed by the host;
   at least one NOR flash memory die mounted on said support and coupled to said controller.

15. The card of claim 14 wherein said memory operation is an erase operation.

16. The card of claim 14 wherein said controller to discard address information and provide phase information in lieu of the discarded address information to said memory die.

17. The card of claim 16 wherein said controller to identify a block of memory from an address.

18. The card of claim 16, said controller to identify a phase from said phase information and perform only a portion of an erase operation.

19. The card of claim 14, said controller to generate a ready signal to a host upon completion of a phase.

20. The card of claim 19, said controller to prevent the memory from powering down when the ready signal is generated.

21. The card of claim 14, said controller to automatically determine how many phases to break a memory operation into based at least in part on the time that a host allows the memory card to complete said operation.

22. A system comprising;
   a processor
   a host coupled to said processor; and
   a memory card coupled to said host, said memory card including a controller, the controller to automatically separate a memory operation from the host into a first and second phase so that the first phase is capable of being completed within a time allowed by a host.

23. The system of claim 22 wherein said controller is coupled to flash memory dice.

24. The system of claim 22 wherein said flash memory dice are NOR flash dice.

* * * * *